US009837628B2

(12) United States Patent
Ma et al.

(10) Patent No.: US 9,837,628 B2
(45) Date of Patent: Dec. 5, 2017

(54) DISPLAY PANEL AND DISPLAY DEVICE

(71) Applicants: Shanghai Tianma AM-OLED Co., Ltd., Shanghai (CN); Tianma Micro-electronics Co., Ltd., Shenzhen (CN)

(72) Inventors: Zhili Ma, Shanghai (CN); Dong Qian, Shanghai (CN); Dongsheng Xu, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/166,537

(22) Filed: May 27, 2016

(65) Prior Publication Data

US 2017/0194593 A1    Jul. 6, 2017

(30) Foreign Application Priority Data

Dec. 31, 2015    (CN) .......................... 2015 1 1031258

(51) Int. Cl.
*H01L 51/52*    (2006.01)
*H01L 27/32*    (2006.01)

(52) U.S. Cl.
CPC ...... *H01L 51/5203* (2013.01); *H01L 27/3276* (2013.01); *H01L 27/3288* (2013.01); *H01L 51/5212* (2013.01); *H01L 51/5253* (2013.01); *H01L 2251/301* (2013.01); *H01L 2251/308* (2013.01)

(58) Field of Classification Search
None
See application file for complete search history.

(56) References Cited

U.S. PATENT DOCUMENTS

| 6,633,270 B2* | 10/2003 | Hashimoto | .......... G09G 3/3233 |
| | | | 315/169.1 |
| 2003/0193792 A1* | 10/2003 | Chang | .................. H01L 27/3288 |
| | | | 361/778 |
| 2004/0000865 A1* | 1/2004 | Yamazaki | ........... H01L 27/3281 |
| | | | 313/506 |
| 2005/0001546 A1* | 1/2005 | Yamaguchi | ........... C23C 14/042 |
| | | | 313/512 |
| 2005/0029937 A1* | 2/2005 | Kim | .................... H01L 27/3276 |
| | | | 313/506 |
| 2006/0001792 A1* | 1/2006 | Choi | ................... G02F 1/13458 |
| | | | 349/54 |

(Continued)

FOREIGN PATENT DOCUMENTS

| CN | 100452421 C | 1/2009 |
| CN | 103927968 A | 7/2014 |

*Primary Examiner* — Lex Malsawma
(74) *Attorney, Agent, or Firm* — Anova Law Group, PLLC

(57) ABSTRACT

A display panel and a display device are provided. The display panel comprise a substrate having a display region, a plurality of pixel units arranged in an array and disposed in the display region of the substrate, a conductive member disposed in a peripheral region of the display region, a plurality of input pins electrically connected to the conductive member and transferring a voltage of an external power supply to the conductive member, and a plurality of power supply lines electrically connected to the conductive member and transferring the voltage from the conductive member to the pixel units.

17 Claims, 9 Drawing Sheets

(56) References Cited

U.S. PATENT DOCUMENTS

| | | | |
|---|---|---|---|
| 2006/0250083 A1* | 11/2006 | Oh | G09G 3/3208 |
| | | | 313/512 |
| 2007/0096135 A1* | 5/2007 | Matsumoto | H01L 27/3276 |
| | | | 257/99 |
| 2007/0194710 A1* | 8/2007 | Song | H01L 27/3276 |
| | | | 313/512 |
| 2007/0195043 A1* | 8/2007 | Furuie | H01L 27/3211 |
| | | | 345/92 |
| 2012/0326951 A1* | 12/2012 | Yamazaki | G02F 1/1345 |
| | | | 345/76 |

* cited by examiner

DISPLAY PANEL AND DISPLAY DEVICE

CROSS-REFERENCES TO RELATED APPLICATIONS

This application claims priority of Chinese Patent Application No. 201511031258.9, filed on Dec. 31, 2015, the entire contents of which are hereby incorporated by reference.

FIELD OF THE INVENTION

The present disclosure generally relates to the field of display technology and, more particularly, relates to a display panel and a display device including the display panel.

BACKGROUND

Since the first organic light-emitting diode (OLED) appeared in 1980s, considerable progress has been made in OLEDs. Commercial products with OLED panels have been introduced to consumers, and the large-scale industrialization of OLEDs is highly desired. OLED technology allows for thinner, brighter, lower power consumption and flexible displays, which is highly expected to be the mainstream of the next generation display technology.

When an OLED display panel is driven to display images, an external power supply is required to provide a voltage to each pixel in the display panel through metal power supply lines. A voltage drop (called "IR drop") often occurs in the metal power supply lines due to the resistance of metal lines, resulting a non-uniform brightness across the display panel. Recently, the display size, the refresh rate and the PPI (pixel per inch) are increased considerably and IR drop may not be neglected.

The disclosed display panel and display device are directed to solve one or more problems set forth above and other problems.

BRIEF SUMMARY OF THE DISCLOSURE

One aspect of the present disclosure provides a display panel. The display panel comprise a substrate having a display region, a plurality of pixel units arranged in an array and disposed in the display region of the substrate, a conductive member disposed in a peripheral region of the display region, a plurality of input pins electrically connected to the conductive member and transferring a voltage of an external power supply to the conductive member, and a plurality of power supply lines electrically connected to the conductive member and transferring the voltage from the conductive member to the pixel units.

Another aspect of the present disclosure provides a display device. The display device comprises a display panel. The display panel comprise a substrate having a display region, a plurality of pixel units arranged in an array and disposed in the display region of the substrate, a conductive member disposed in a peripheral region of the display region, a plurality of input pins electrically connected to the conductive member and transferring a voltage of an external power supply to the conductive member, and a plurality of power supply lines electrically connected to the conductive member and transferring the voltage from the conductive member to the pixel units.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined or separated under conditions without conflicts.

Figure 1:
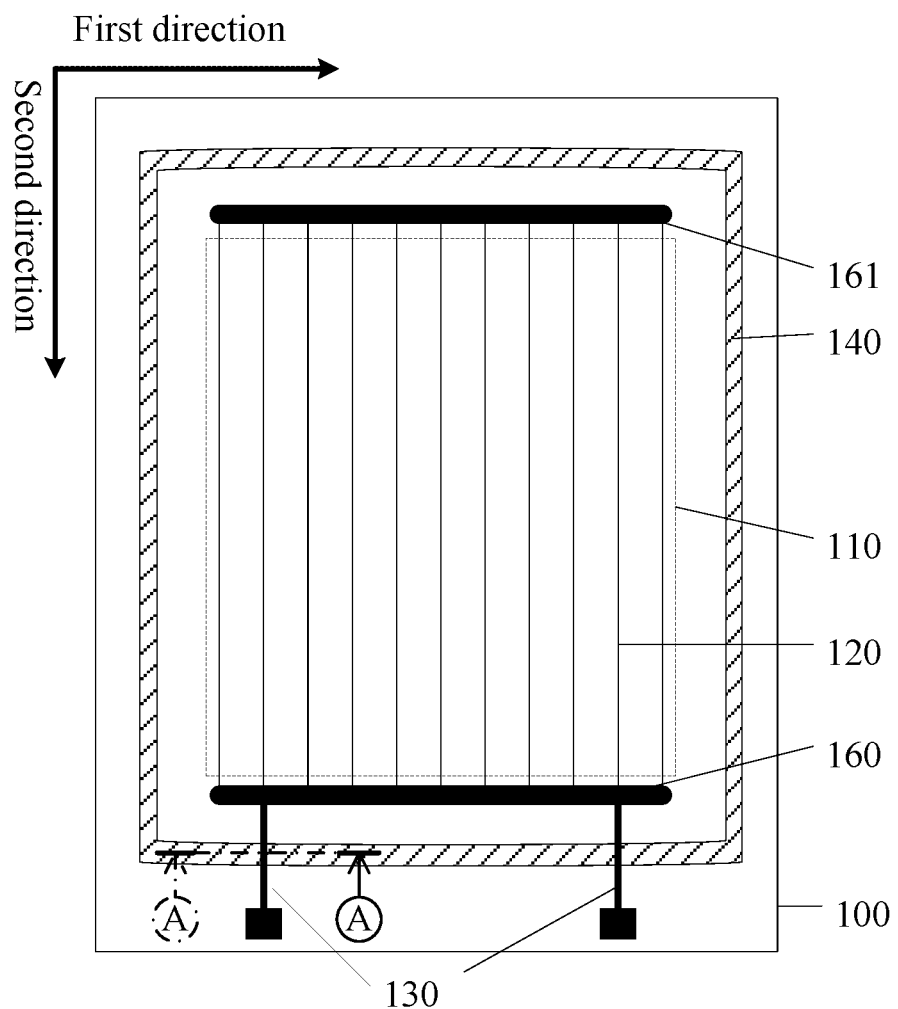
FIG. 1 illustrates a wiring diagram of an organic light-emitting diode (OLED) display panel.

FIG. 1 illustrates a wiring diagram of an organic light-emitting diode (OLED) display panel. As shown in FIG. 1, a display region 110, an encapsulation region 140, a plurality of power supply lines 120, two common lines 160 and 161, and a plurality of external power supply voltage input pins 130 are disposed on a substrate 100. The pixels in the display region 110 are electrically connected to the power supply lines 120, and the common lines 160 and 161 disposed outside the display region 110 are electrically connected to two ends of each power supply line 120, respectively. The external power supply voltage input pins 130 disposed outside the encapsulation region 140 are electrically connected to the common line 160 through penetrating the encapsulation region 140. The external power supply voltage input pins are called as the input pins in the following description.

When the display panel is driven to display images, first the input pins 130 transfer the voltage of the external power supply (i.e., external power supply voltage) to the common line 160, then the common line 160 transfers the voltage to each power supply line 120. Finally, the power supply lines 120 transfers the voltage to each pixel in the display region 110. That is, the external power supply voltage is sequentially transferred to the input pins 130, the common line 160, the power supply lines 120 and the pixels. The common line 161 disposed at the other ends of the power supply lines 120 is only electrically connected to the power supply lines 120, not applied with any external power supply voltage. That is, the external power supply voltage is transferred to the pixels from one edge of the display region 110, i.e., the edge close to the common line 160.

When the external power supply voltage is gradually transferred to the pixels through the power supply lines 120, each pixel in the display region 110 may receive a different voltage due to the resistance of the power supply lines 120. The pixels close to the common line 160 receive higher voltages, while the pixels far away from to the common line 160 receive lower voltages. That is, a voltage drop occurs across the display panel due to the self-resistance of power supply lines 120, which is called as IR drop. Given a same data signal (i.e., a same external power supply voltage), the display panel may exhibit a higher brightness at one edge than the another edge, and the displayed image may have a non-uniform brightness.

On the other hand, demand for high PPI (pixel per inch) brings new challenges to design a wiring diagram of the display region 110. The width of the power supply line 120 is substantially restricted, thus the self-resistance of power supply lines 120 is difficult to be effectively reduced, and the IR drop across the display panel becomes more obvious. Further, as the size of the display panel increases, the displayed image may exhibit a severer non-uniform brightness.

Figure 2:
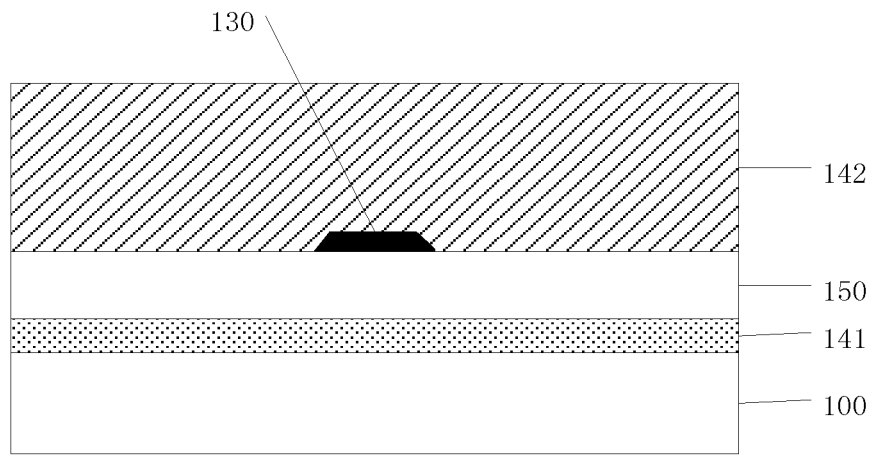
FIG. 2 illustrates an AA cross-sectional view of an OLED display panel in FIG. 1.

FIG. 2 illustrates an AA cross-sectional view of a display panel in FIG. 1. As shown in FIG. 2, the encapsulation region 140 includes an encapsulation member 142 and a frit metal 141 disposed beneath the encapsulation member. Referring to FIG. 1 and FIG. 2, the input pins 130 disposed outside the encapsulation region 140 directly penetrate the encapsulation member 142 to be electrically connected to the common line 160 in the display region 110, which may cause cracking in the encapsulation member 142 and a packaging failure.

Figure 3:
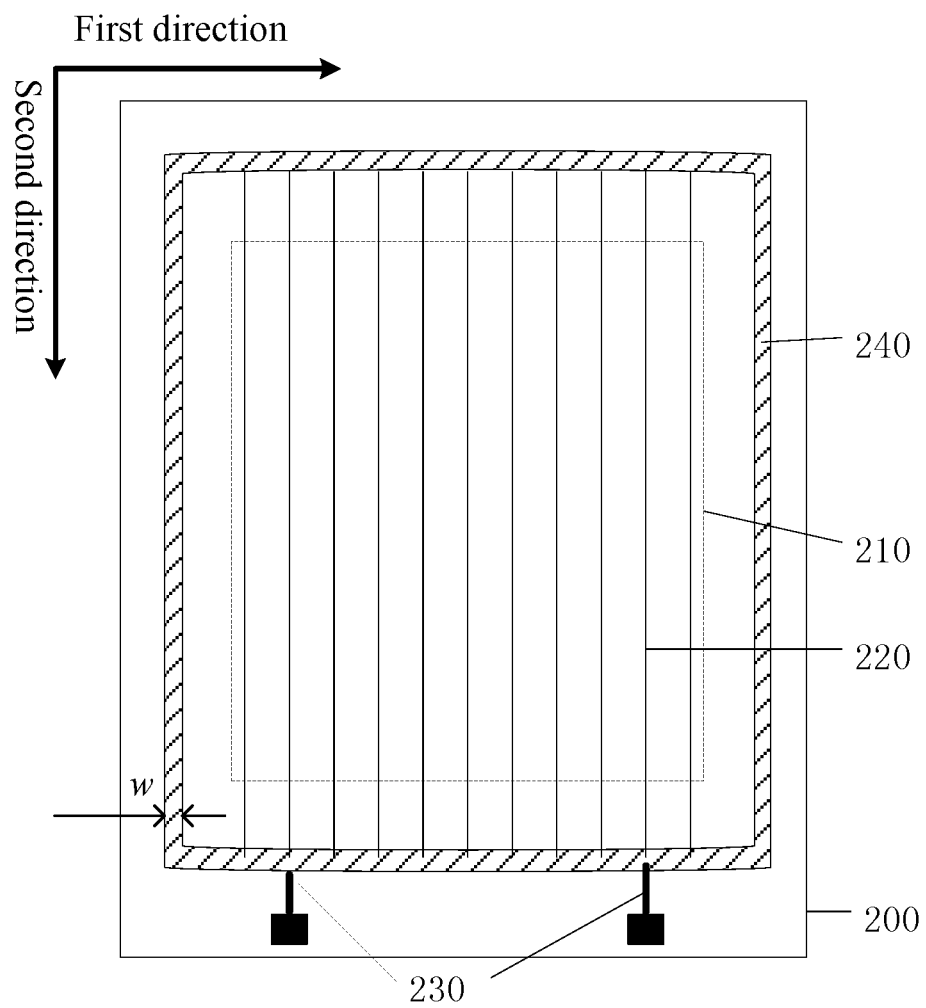
FIG. 3 illustrates a wiring diagram of an exemplary display panel consistent with disclosed embodiments.

The present disclosure provides an improved display panel. FIG. 3 illustrates a wiring diagram of an exemplary display panel consistent with disclosed embodiments. The display panel may be any appropriate type of display panels capable of displaying videos and/or images, such as plasma display panel (PDP), field emission display (FED) panel, liquid crystal display (LCD) panel, organic light-emitting diode (OLED) display panel, light-emitting diode (LED) display panel, quantum dots (QDs) display panel, electrophoretic display panels (i.e., e-readers) or other types of display panels. The corresponding display device may also be any appropriate type of display devices including the disclosed display panels. In the disclosed embodiments, the display panel may be an OLED display panel and the corresponding display device may be an OLED display device.

As shown in FIG. 3, the display panel may include a substrate 200, a display region 210, an encapsulation region (not drawn in FIG. 3), a conductive member 240, a plurality of input pins 230 and a plurality of power supply lines 220. The display region 210 may be disposed on the substrate 200 and may include a plurality of pixel units arranged in an array. The pixel unit may be any appropriate pixel unit or sub-pixel unit displaying an image or image element, and the power supply lines 220 may be any appropriate power supply line transferring data signals or grey level data signals to the pixel units. The conductive member 240 may be disposed at the periphery of the display region 210, and surround the display region 210. The external power supply voltage input pins are called as the input pins in the following description.

The input pins 230 may be disposed outside the conductive member 240 and electrically connected to the conductive member 240, transferring an external power supply voltage to the conductive member 240. Each power supply line 220 may have both ends electrically connected to the conductive member 240, transferring the voltage at the conductive member 240 to the pixels in the display region 210.

In one embodiment, as shown in FIG. 3, the display panel may include two input pins 230. The display region 210 may have a rectangular shape, and the conductive member 240 may have a rectangular frame shape and surround the display region 210. The shape of the display region 210 and the shape of the conductive member 240 shown in FIG. 3 are only for illustrative purposes and are not intended to limit the scope of the present disclosure.

Further, the encapsulation region may include an encapsulation member and a frit metal disposed beneath the encapsulation member. The conductive member 240 may be configured to be the frit metal beneath the encapsulation member. The encapsulation member may encapsulate the display panel to prevent a displaying element (e.g., emitting and electrode materials) in the display panel from being damaged by moisture and oxygen flowing in from the outside of the displaying element. The frit metal may be able to reflect incident laser and stand a high temperature, which may facilitate the processing of the encapsulation member to encapsulate the display panel.

The conductive member 240, i.e., the frit metal disposed beneath the encapsulation member, may be indium tin oxide (ITO), or at least one of gold, silver, copper, aluminum, and molybdenum. In the disclosed embodiments, the encapsulation member may be frit glass, and the frit metal may be molybdenum. In another embodiment, the encapsulation member and the frit metal may be any proper martials with desired properties.

It should be noted that, the display panel 200 may further include a first metal layer, and the frit metal (i.e., the conductive member 240) may be disposed at the first metal layer. In the disclosed embodiments, the input pins 230 and the power supply lines 220 may also be disposed at the first metal layer, i.e., the input pins 230, the power supply lines 220 and the frit metal may be disposed in the same layer. Meanwhile, the input pins 230 and the power supply lines 220 may be electrically connected to the frit metal, respectively.

That is, within the first metal layer, the input pins 230 disposed outside the encapsulation region may be electrically connected to the conductive member 240 (i.e., the frit metal), and the conductive member 240 (i.e., the frit metal) may be electrically connected to the power supply lines 220. Thus, the external power supply voltage may be first transferred to the conductive member 240 (i.e., the frit metal) disposed outside the display region 210 through the input pins 230, then the conductive member 240 may transfer the voltage to the pixel units simultaneously from at least two edges of the display region 210 through the power supply lines 220.

In one embodiment, as shown in FIG. 3, the power supply lines 220 may extend in a second direction, and both ends of each power supply line 220 may be electrically connected to the conductive member 240. The external power supply voltage may be transferred to the pixel units simultaneously from two edges of the display region 210 in the second direction, i.e., from two ends of the power supply lines 220 extending in the second direction. For example, as shown in FIG. 3, the second direction may be a top-to-bottom direction, and the external power supply voltage may be simultaneously transferred to the pixel units from the top edge and the bottom edge of the display region 210, i.e., from the top edge and the bottom of the conductive member 240.

To obtain a substantially small voltage drop in the frit metal, the line width w of the frit metal may be specifically designed according to various parameters of the display panel, such as the display panel size, PPI, and refresh rate, etc. In one embodiment, the frit metal may have a width of approximately 400-650 µm, and the voltage drop in the frit metal, because of the self-resistance, may be substantially small. That is, the voltage difference between the top edge and the bottom of the conductive member 240 may be substantially small. Accordingly, the brightness difference between the top edge and the bottom of the display region 210 may be substantially small. When the external power supply voltage is simultaneously transferred to the pixel units from the top edge and the bottom edge of the display region 210, the IR drop across the display region 210 may be reduced, and the brightness non-uniformity across the display region 210 may be minimized.

Figure 4:
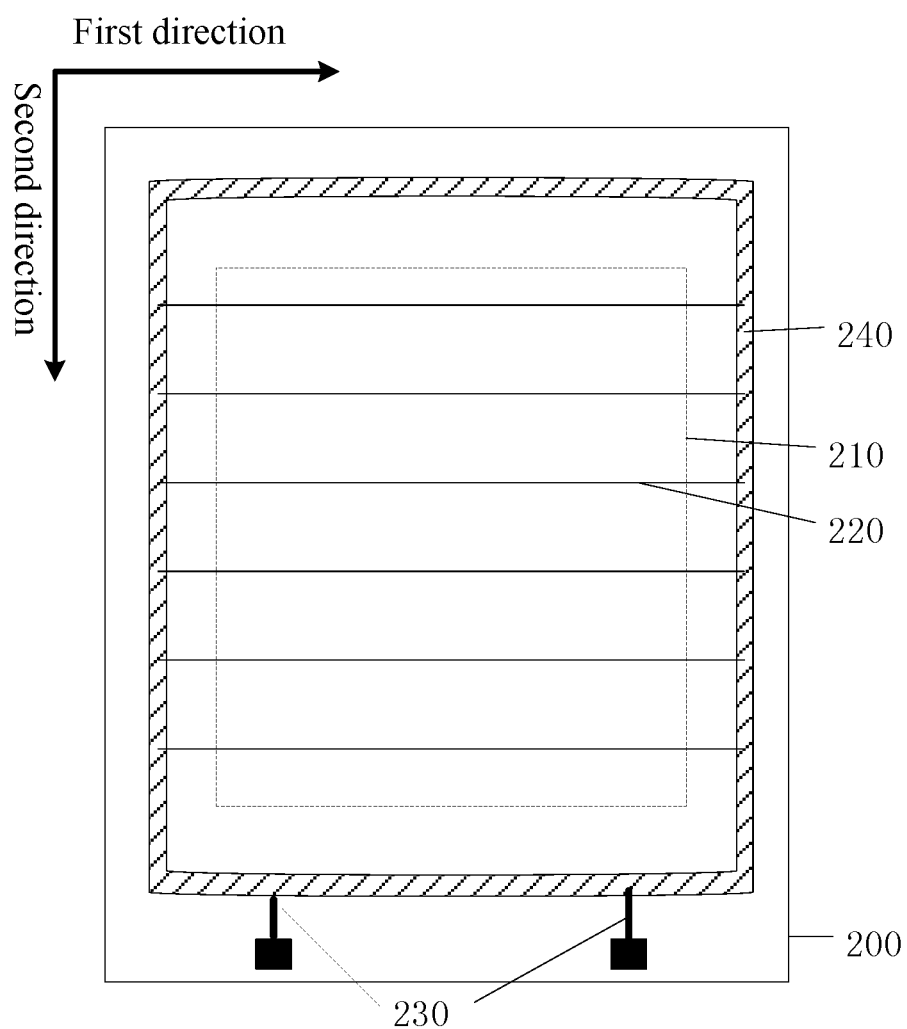
FIG. 4 illustrates a wiring diagram of another exemplary display panel consistent with disclosed embodiments.

In another embodiment, the power supply lines 220 may extend in a first direction different from the second direction, and both ends of each power supply line 220 may be electrically connected to the conductive member 240. The corresponding wiring diagram is shown in FIG. 4. In another embodiment, the power supply lines 220 may include a plurality of first power supply lines extending in the first direction and a plurality of second power supply lines extending in the second direction. Both ends of each power supply line may be electrically connected to the conductive member 240. That is, the power supply lines 220 may have a grid arrangement within the display region 210. The corresponding wiring diagram is shown in FIG. 5.

FIG. 4 illustrates a wiring diagram of another exemplary display panel consistent with disclosed embodiments. The similarities between FIG. 3 and FIG. 4 are not repeated here, while certain differences may be illustrated. As shown in FIG. 4, the power supply lines 220 may extend in a first direction, and each power supply line 220 may have both ends electrically connected to the conductive member 240. The external power supply voltage may be first transferred to the conductive member 240 (i.e., the frit metal) disposed outside the display region 210 through the input pins 230, then the conductive member 240 may transfer the voltage to the pixel units simultaneously from two edges of the display region 210 through the power supply lines 220 extending in the first direction, i.e., from both ends of the power supply lines 220 extending in the first direction.

For example, as shown in FIG. 4, the first direction may be a left-to-right direction, and the external power supply voltage may be simultaneously transferred to the pixel units from the left edge and the right edge of the display region 210.

Figure 5:
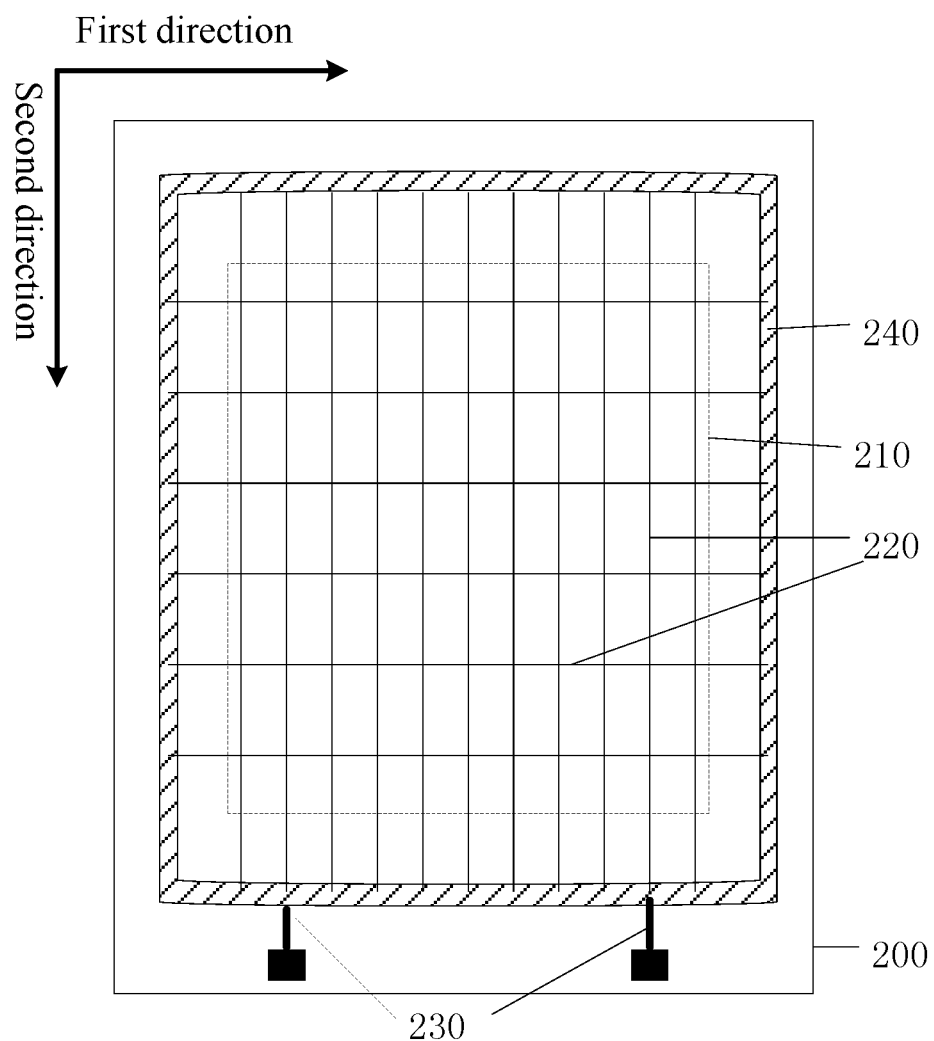
FIG. 5 illustrates a wiring diagram of another exemplary display panel consistent with disclosed embodiments.

FIG. 5 illustrates a wiring diagram of another exemplary display panel consistent with disclosed embodiments. The similarities between FIG. 3 and FIG. 5 are not repeated here, while certain differences may be illustrated. As shown in FIG. 5, the display panel may include a plurality of first power supply lines 220 extending in the first direction and a plurality of second power supply lines 220 extending in the second direction. Both ends of each power supply line may be electrically connected to the conductive member 240. That is, the power supply lines 220 may have a grid arrangement within the display region 210.

The external power supply voltage may be first transferred to the conductive member 240 (i.e., the frit metal) disposed outside the display region 210 through the input pins 230. Then the conductive member 240 may transfer the voltage to the pixel units simultaneously from two edges of the display region 210 through the power supply lines 220 extending in the first direction and, meanwhile, from the other two edges of the display region 210 through the power supply lines 220 extending in the second direction.

For example, as shown in FIG. 5, the first direction may be a left-to-right direction, and the second direction may be a top-to-bottom direction. The external power supply voltage may be simultaneously transferred to the pixel units from the left edge, the right edge, the top edge, and the bottom edge of the display region 210. The first direction may be perpendicular to the second direction, i.e., the angle between the first direction and the second direction may be approximately 90°. In certain embodiments, the angle between the first direction and the second direction may vary according to various fabrication process and application scenarios.

As discussed above, in the disclosed display panels, the external power supply voltage may be first transferred to the conductive member 240 (i.e., the frit metal) disposed outside the display region 210 through the input pins 230, then the conductive member 240 may transfer the voltage to the pixel units simultaneously from at least two edges of the display region 210 through the power supply lines 220. On the other hand, the frit metal may have a width of approximately 400-650 µm and, because of the self-resistance, the voltage drop in the frit metal may be substantially small. Compared to the current display panel in which the external power supply voltage is transferred to the pixel units only from one edge of the display region, the IR drop in the disclosed display panels may be reduced, and the brightness non-uniformity across the disclosed display panels may be minimized.

Meanwhile, the frit metal used in the current display panel may be adopted as the conductive member 240 in the disclosed display panels, through slightly changing the wiring diagram of the current display panel without introducing new components. That is, the reduction of the IR drop in the disclosed display panels may be realized without modifying the overall structure of the current display panel. Thus, the fabrication process of the current display panel may be still applicable to the disposed display panel.

Figure 6:
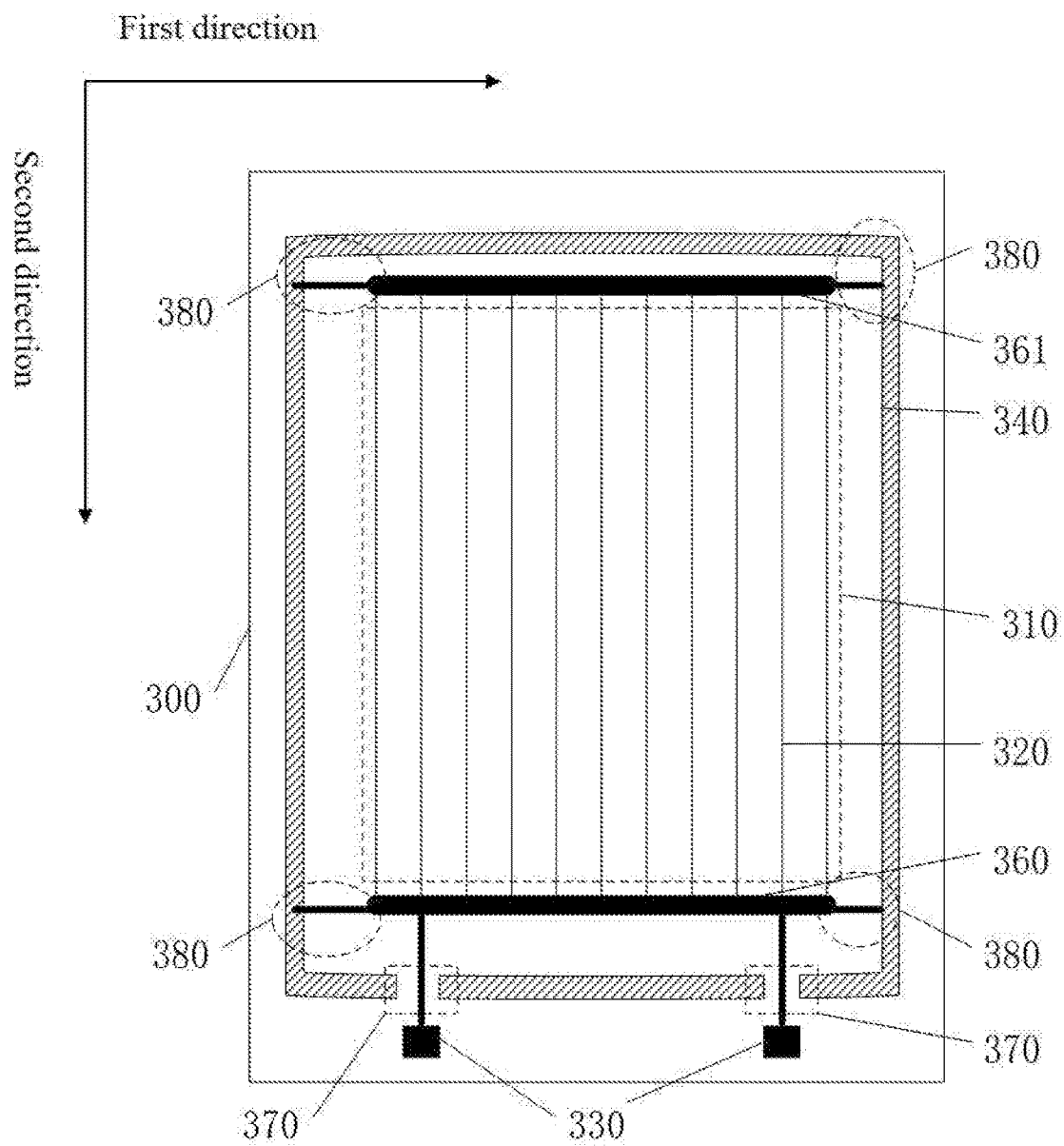
FIG. 6 illustrates a wiring diagram of another exemplary display panel consistent with disclosed embodiments.

FIG. 6 illustrates a wiring diagram of another exemplary display panel consistent with disclosed embodiments. The similarities between FIG. 3 and FIG. 6 are not repeated here, while certain differences may be illustrated. As shown in FIG. 6, the display panel may include a substrate 300, a display region 310, an encapsulation region (not drawn in FIG. 6), an encapsulation region 340, a plurality of input pins 330, a plurality of power supply lines 320, at least one common line 360 (or 361). In one embodiment, as shown in FIG. 6, the display panel may include two input pins 330, a first common line 360 and a second common line 361.

The display region 310 may be disposed on the substrate 300 and may include a plurality of pixel units arranged in an array. The conductive member 340 may be disposed at the periphery of the display region 310, and may surround the display region 310. The first common line 360 and the second common line 361 may be disposed in the encapsulation region 340 and may be disposed at two ends of the power supply lines 320 and electrically connected to two ends of the power supply lines 320, respectively.

Further, the first common line 360 and the second common line 361 may be electrically connected to the frit metal in the first metal layer in the encapsulation region 340, respectively. Each of the first common line 360 and the second common line 361 may have one end or both ends electrically connected to the frit metal in the first metal layer in the encapsulation region 340, respectively. For example, as show in FIG. 6, each of the first common line 360 and the second common line 361 may have both ends electrically connected to the frit metal in the first metal layer in the encapsulation region 340, respectively.

In the disclosed display panel, the input pins, the first common line 360 and the second common line 361 may be disposed at a same metal layer. Thus, the first common line 360, the second common line 361, the input pins 330, the power supply lines 320 and the frit metal may be disposed at a same metal layer, i.e., the first metal layer. Both ends of the first common line 360 and both ends of the second common line 361 may be electrically connected to the frit metal through leads 380, respectively.

The frit metal may be configured to have a plurality of first openings (or first through-holes) 370, which may disconnect the frit metal. The input pins 330 disposed outside the encapsulation region 340 may be electrically connected to the first common line 360 through penetrating the first openings 370. In one embodiment, as shown in FIG. 6, the display panel may include two first openings 370 corresponding to the two input pins 330, and each input pin 330 may be electrically connected to the first common line 360 through penetrating the corresponding first opening 370.

Thus, the external power supply voltage may be first transferred to the conductive member (i.e., the frit metal in the encapsulation region) disposed outside the display region through the input pins, then the conductive member may transfer the voltage to the pixel units simultaneously from at least two edges of the display region through the power supply lines. The IR drop across the display panels may be reduced. Further, through the first common line 360 and the second common line 361, the power supply lines 320 and the frit metal may be configured to be electrically connected in parallel, and the corresponding resistance may be reduced. Thus, the voltage difference between the top edge and the bottom edge of the display region 310 may be further reduced, and the brightness difference between the top edge and the bottom edge of the display region 310 may be further reduced accordingly.

It should be noted that, in the disclosed embodiments, the power supply lines 320 may be electrically connected to the conductive member 340 through various electrical connections. For illustrative purposes, the power supply lines 320 in the display panel shown in FIG. 6 may extend in the second direction, and both ends of the second power supply lines 320 may have be electrically connected to the conductive member 340.

Figure 7:
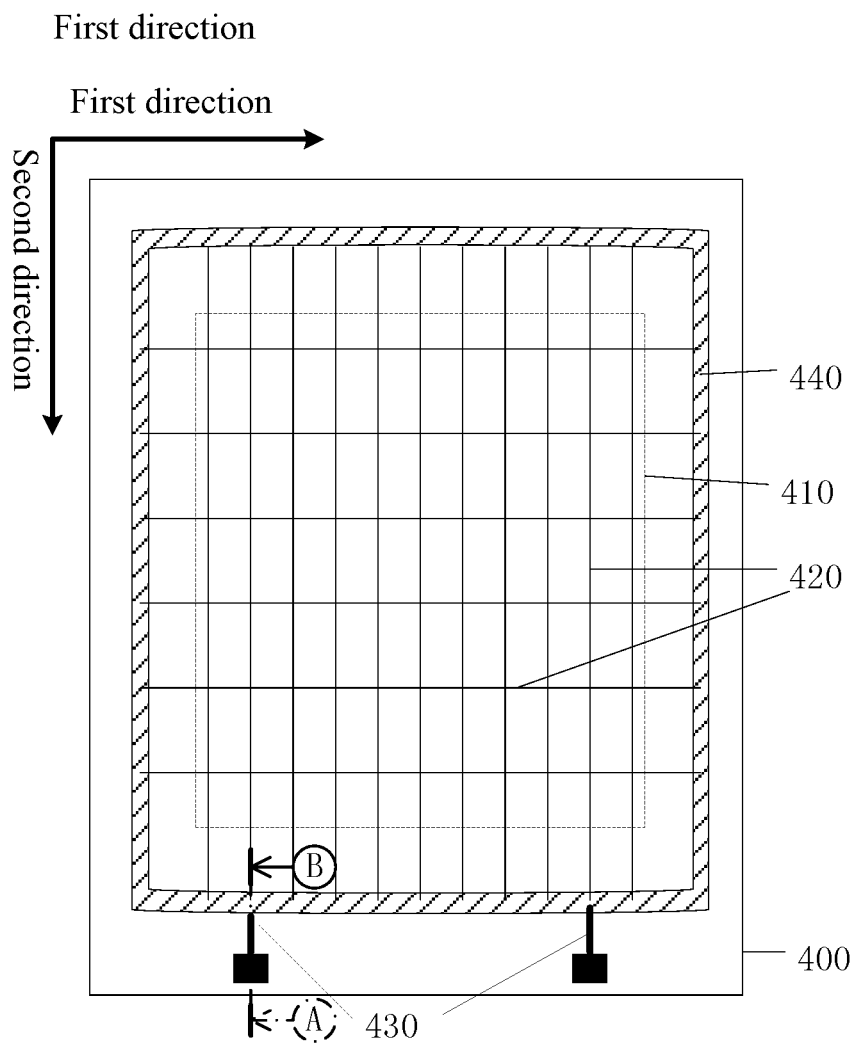
FIG. 7 illustrates a wiring diagram of another exemplary display panel consistent with disclosed embodiments.
Figure 8:
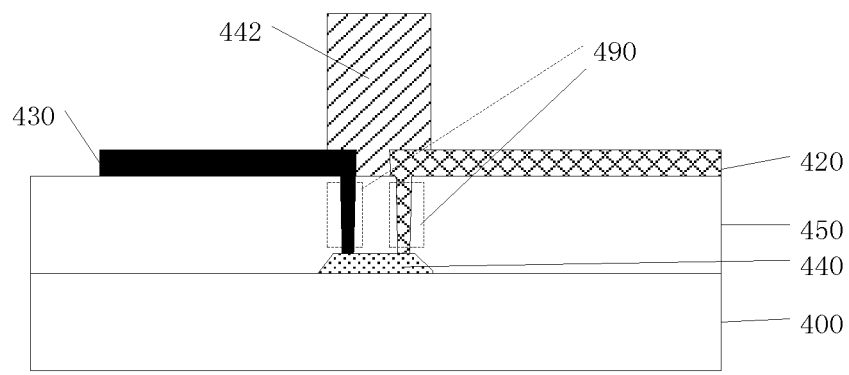
FIG. 8 illustrates an AB cross-sectional view of another exemplary display panel in FIG. 7 consistent with disclosed embodiments.

FIG. 7 illustrates a wiring diagram of another exemplary display panel consistent with disclosed embodiments. FIG. 8 illustrates an AB cross-sectional view of another exemplary display panel in FIG. 7 consistent with disclosed embodiments. The similarities between FIG. 7 and FIG. 5 are not repeated here, while certain differences may be illustrated. Compared to the display panel shown in FIG. 5, the display panel shown in FIGS. 7-8 may include a first metal layer, a second metal layer, and at least one insulation layer 450 sandwiched between the first metal layer and the second metal layer. A frit metal (i.e., conductive member) 440 may be disposed at the first metal layer, and input pins 430 and power supply lines 420 may be disposed at the second metal layer.

To build the electrical connection between the input pins 430 and the conductive member (i.e., the frit metal) 440 as well as the electrical connection between the power supply lines 420 and the conductive member (i.e., the frit metal) 440, the insulation layer 450 may include a plurality of through-holes 490. The frit metal 440 may be disposed beneath the encapsulation member 442 in the encapsulation region 440. The frit metal 440 may be electrically connected to the input pins 430 and the power supply lines 420 through the through-holes 490, respectively.

In one embodiment, referring to FIG. 7 and FIG. 8, the display panel may include one insulation layer 450 sandwiched between the second metal layer including the input pins 430 (and the power supply lines 420) and the first metal layer including frit metal 440. Each input pin 30 may be electrically connected to the frit metal 440 through one through-hole 490, and both ends of each power supply line 420 may be electrically connected to the frit metal 440 through one through-hole 490, respectively.

It should be noted that, in the disclosed embodiments, the power supply lines 420 may be electrically connected to the conductive member 440 through various electrical connection. For illustrative purposes, the power supply lines 420 in the display panel shown in FIG. 7 may have a grid armament. That is, the power supply lines 220 may include a plurality of first power supply lines extending in the first direction and a plurality of second power supply lines extending in the second direction. The first power supply lines 420 may be electrically connected to the conductive member 440 through two ends in the first direction, and both ends of the second power supply lines 420 may be electrically connected to the conductive member 440.

Further, as long as either of the input pins and the power supply lines are disposed in the second metal layer, i.e., not disposed in a same layer as the frit metal, the through-holes may have to be formed in the insulation layer, to realize the electrical connection between the frit metal and either of the input pins and the power supply lines not disposed in the same layer as the frit metal.

Figure 9:
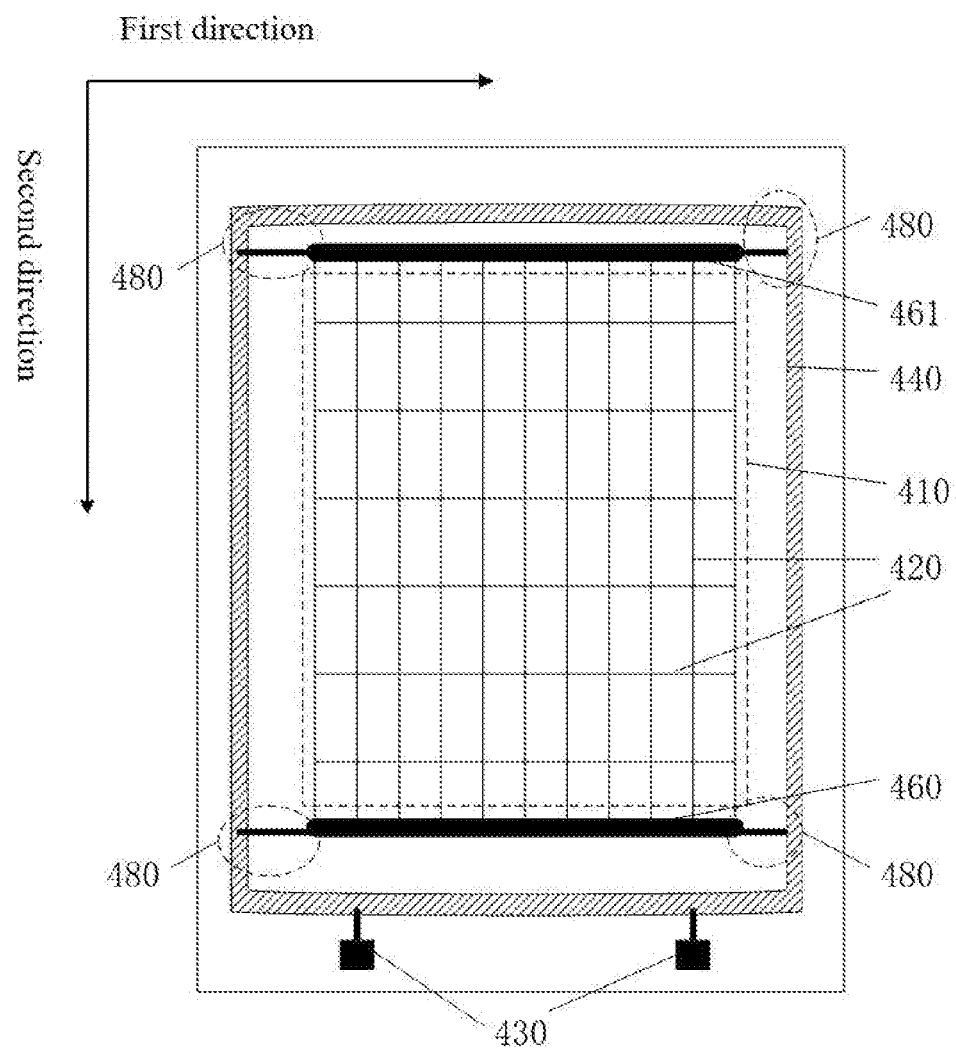
FIG. 9 illustrates a wiring diagram of another exemplary display panel consistent with disclosed embodiments.

FIG. 9 illustrates a wiring diagram of another exemplary display panel consistent with disclosed embodiments. The similarities between FIG. 7 and FIG. 9 are not repeated here, while certain differences may be illustrated. Different from the display panel shown in FIG. 7, the display panel shown in FIG. 9 may further include at least one common line 460 or 461. In one embodiment, as shown in FIG. 9, the display panel may include a first common line 460 and a second common line 461, which may be disposed at two ends of power supply lines 420 and electrically connected to two ends of the of the power supply lines 420, respectively. The frit metal may be disposed at the first metal layer, while the first common line 460, the second common line 461, the power supply lines 420 and the input pins 430 may be disposed at the second metal layer.

Further, the first common line 460 and the second common line 461 may be electrically connected to the frit metal disposed at the first metal layer, respectively. Each of the first common line 460 and the second common line 461 may have one end or both ends electrically connected to the frit metal, respectively. For example, as show in FIG. 9, each of the first common line 460 and the second common line 461 may have both ends electrically connected to the frit metal, respectively.

The insulation layer between the first metal layer and the second metal layer may include a plurality of through-holes, through which the frit metal may be electrically connected to the input pins 430 and the leads 480 at two ends of the first common line 460 and the second common line 461, respectively.

Thus, the input pins 430 may first transfer the external power supply voltage to the conductive member (i.e., the frit metal in the encapsulation region) 440 in the first metal layer through the through-holes 490 in the insulation layer 450, then the conductive member 440 may transfer the voltage to the first common line 460 and the second common line 461 through the through-holes 490 in the insulation layer 450. Finally, the power supply lines 420 may transfer the voltage to the pixel units simultaneously from two edges of the display region 410 adjacent to the first common line 460 and the second common line 461, respectively.

Further, through the first common line 460 and the second common line 461, the power supply lines 420 and the frit metal 440 may be configured to be electrically connected in parallel, and the corresponding resistance may be reduced. Thus, the voltage difference between the top edge and the bottom edge of the display region 410 may be further reduced, and the brightness difference between the top edge and the bottom edge of the display region 410 may be further reduced accordingly. Thus, the IR drop across the display panels may be reduced, and the brightness non-uniformity across the display panels may be minimized.

Figure 10:
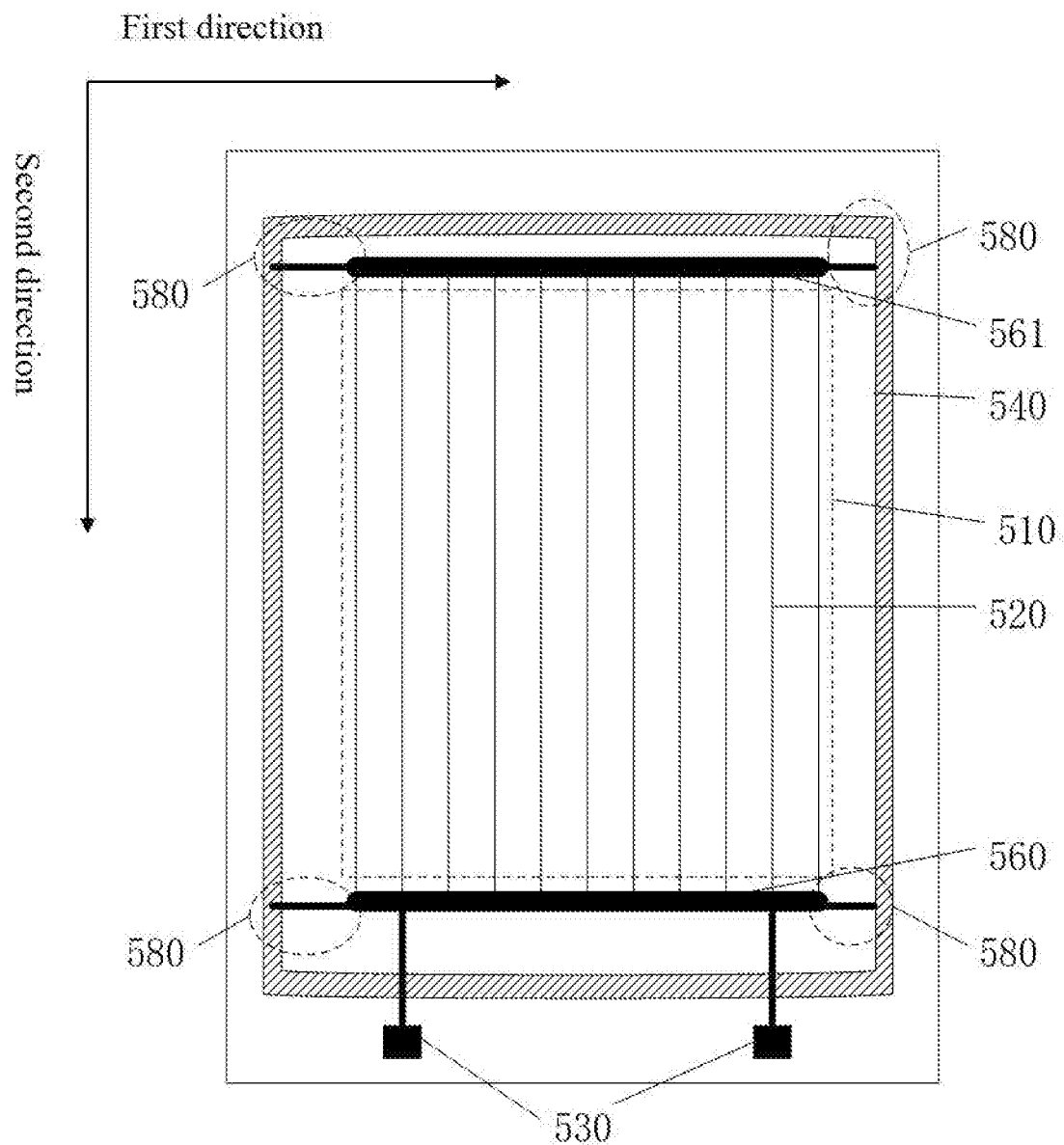
FIG. 10 illustrates a wiring diagram of another exemplary display panel consistent with disclosed embodiments.

FIG. 10 illustrates a wiring diagram of another exemplary display panel consistent with disclosed embodiments. The similarities between FIG. 10 and FIG. 9 are not repeated here, while certain differences may be illustrated. Similar to the display panel shown in FIG. 9, the display panel shown in FIG. 10 may also include a frit metal disposed at a first metal layer, and a first common line 560, a second common line 561, a plurality of power supply lines 520 and a plurality of input pins 530 disposed at a second metal layer.

Different from the in the display panel shown in FIG. 9, in the display panel shown in FIG. 10, the input pins 530 disposed outside an encapsulation region 540 may be electrically connected to the first common line 560 through penetrating an encapsulation member in the encapsulation region 540. That is, the input pins 530 may penetrate the encapsulation member in the encapsulation region 540 to be directly electrically connected to the first common line 560, instead of forming through-holes in an insulation layer above the frit metal. Further, the insulation layer between the first metal layer and the second metal layer may include a plurality of through-holes, through which the frit metal may be electrically connected to the leads 580 connecting two ends of the first common line 560 and the second common line 561, respectively.

Thus, the input pins 530 may first directly transfer the external power supply voltage to the conductive member (i.e., the frit metal in the encapsulation region) 540 in the first metal layer, then the conductive member 540 may transfer the voltage to the first common line 560 and the second common line 561 via the through-holes in the insulation layer. Finally, the power supply lines 520 may transfer the voltage to the pixel units simultaneously from two edges of the display region disposed with the first common line 560 and the second common line 561, respectively. The IR drop across the display panels may be reduced, and the brightness non-uniformity across the display panels may be minimized.

It should be noted that, in the disclosed embodiments, the common lines (i.e., the first common line and the second common line) may be disposed at two ends of the power supply lines and electrically to the power supply lines, respectively. The common lines and the power supply lines may be disposed in the same layer. In another embodiment, the common lines and the power supply lines may be disposed in different layers. That is, the common lines may be disposed in the first metal layer and the power supply lines may be disposed in the second metal layer, or vice versa. When the common lines and the power supply lines are disposed in different layers, the common lines may be electrically connected to the power supply lines through forming through-holes in the insulation layer between the metal layer including the common lines and the metal layers including the power supply lines.

Further, the power supply lines may be electrically connected to the conductive member through various electrical connection. In one embodiment, the power supply lines may extend in the first direction, and may be electrically connected to the conductive member through two ends in the first direction. In another embodiment, the power supply lines may extend in the second direction, and may be electrically connected to the conductive member through two ends in the second direction. In another embodiment, the power supply lines may include a plurality of first power supply lines extending in the first direction and a plurality of second power supply lines extending in the second direction. The first power supply lines may be electrically connected to the conductive member through two ends in the first direction, and the second power supply lines may be electrically connected to the conductive member through two ends in the second direction.

The first direction may have an angle with respect to the second direction. In one embodiment, the first direction may be perpendicular to the second direction, i.e., the angle between the first direction and the second direction may be approximately 90°. In another embodiment, the angle between the first direction and the second direction may vary according to various fabrication process and application scenarios. The display region may also have an irregular shape, such as a circular shape, an oval shape, and a triangular shape, etc.

Figure 11:
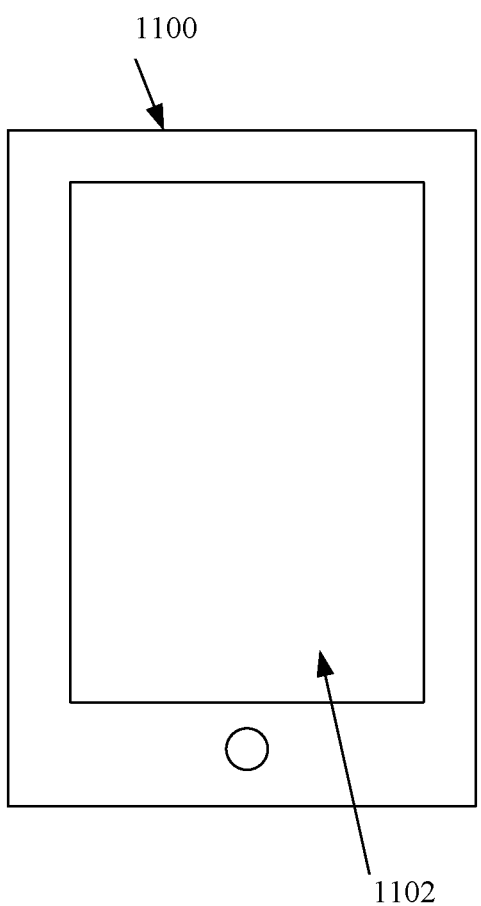
FIG. 11 illustrates an exemplary display device consistent with disclosed embodiments.

The present disclosure further provides a display device. FIG. 11 illustrates an exemplary display device consistent with disclosed embodiments. As shown in FIG. 11, the display device may include any one of the disclosed display panels 1100. For example, the display device 1100 may be a tablet, a TV, a smartphone, a notebook, and a smartwatch including any of the disclosed display panel 1102, etc. Further, the display device 1100 may be any appropriate type of content-presentation devices including any of the disclosed display panel 1102. The disclosed display device may also exhibit same advantages as the disclosed display panel, i.e., the IR drop across the display device may be reduced, and the brightness non-uniformity at edges of the display device be minimized.

In the disclosed embodiments, the external power supply voltage may be first transferred to the conductive member, then the conductive member may transfer the voltage to the pixel units simultaneously from at least two edges of the display region through the power supply lines. The IR drop across the display panel may be reduced, and the brightness non-uniformity at the edges of the display panel be minimized.

The frit metal used in the current display panel may be adopted as the conductive member in the disclosed display panels, through slightly changing the wiring diagram of the current display panel without introducing new components. That is, the reduction of the IR drop in the disclosed display panels may be realized without modifying the overall structure of the current display panel. Thus, the fabrication process of the current display panel may be still applicable to the disposed display panel.

Further, in one embodiment, the input pins may be electrically connected to the conductive member through the through-holes, and the conductive member may transfer the external power supply voltage to the display region. Compared to the display panel in which the input pins are electrically connected to the common line in the display panel through directly penetrating the encapsulation member in the encapsulation region, the cracking in the encapsulation member may be prevented, and the packaging quality may be significantly improved.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A display panel, comprising:
a substrate having a display region;
a plurality of pixel units arranged in an array and disposed in the display region of the substrate;
a conductive member and an encapsulation region disposed in a peripheral region of the display region;
a plurality of input pins electrically connected to the conductive member and transferring a voltage of an external power supply to the conductive member; and
a plurality of power supply lines electrically connected to the conductive member and transferring the voltage from the conductive member to the pixel units,
wherein the encapsulation region includes an encapsulation member and a frit metal disposed beneath the encapsulation member, and
the conductive member is the frit metal disposed beneath the encapsulation member.

2. The display panel according to claim 1, wherein:
the conductive member is made of indium tin oxide (ITO), or at least one of gold, silver, copper, aluminum, and molybdenum.

3. The display panel according to claim 1, wherein:
the power supply line extends in a first direction; and
both ends of the power supply line are electrically connected to the conductive member.

4. A display panel according, comprising:
a substrate having a display region;
a plurality of pixel units arranged in an array and disposed in the display region of the substrate;
a conductive member and an encapsulation region disposed in a peripheral region of the display region;
a plurality of input pins electrically connected to the conductive member and transferring a voltage of an external power supply to the conductive member; and
a plurality of power supply lines electrically connected to the conductive member and transferring the voltage from the conductive member to the pixel units, wherein:
the plurality of power supply lines include a plurality of first power supply lines extending in a first direction and a plurality of second power supply lines extending in a second direction;
both ends of the first power supply line are electrically connected to the conductive member; and
both ends of the second power supply line are electrically connected to the conductive member.

5. The display panel according to claim 4, wherein:
the first direction is perpendicular to the second direction.

6. The display panel according to claim 1, further including:
a first metal layer;
a second metal layer; and
at last one insulation layer sandwiched between the first metal layer and the second metal layer,
wherein the frit metal is disposed at the first metal layer.

7. The display panel according to claim 6, wherein:
at least either of the input pins and the power supply lines are disposed at the first metal layer and are electrically connected to the frit metal.

8. The display panel according to claim 6, wherein:
at least either of the input pins and the power supply lines are disposed at the second metal layer.

9. The display panel according to claim 8, wherein:
the insulation layer includes a plurality of through-holes; and
at least either of the input pins and the power supply lines disposed at the second metal layer are electrically connected to the frit metal through the through-holes.

10. The display panel according to claim 6, further including:
a first common line; and
a second common line,
wherein the first common line and the second common line are electrically connected to the frit metal.

11. The display panel according to claim 10, wherein:
both ends of the first common line are electrically connected to the frit metal, respectively; and
both ends of the second common line are electrically connected to the frit metal, respectively.

12. The display panel according to claim 10, wherein:
the power supply lines, the first common line, and the second common line are disposed at a same metal layer.

13. The display panel according to claim 12, wherein:
the input pins are disposed at the first meta layer;
the first metal layer has a plurality of first openings disconnecting the first metal layer; and
the input pins penetrate the first openings to be electrically connected to the first common line.

14. The display panel according to claim 12, wherein:
the input pins are disposed at the second meta layer and penetrate the encapsulation member to be electrically connected to the first common line.

15. The display panel according to claim 1, wherein:
the display panel is an organic light-emitting diode display panel.

16. The display panel according to claim 1, wherein:
the conductive member surrounds the display region.

17. A device comprises a display panel, wherein, the display panel comprises:
a substrate having a display region;
a plurality of pixel units arranged in an array and disposed in the display region of the substrate;
a conductive member and an encapsulation region disposed in a peripheral region of the display region;

a plurality of input pins electrically connected to the conductive member and transferring a voltage of an external power supply to the conductive member; and a plurality of power supply lines electrically connected to the conductive member and transferring the voltage from the conductive member to the pixel units, wherein the encapsulation region includes an encapsulation member and a frit metal disposed beneath the encapsulation member, and the conductive member is the frit metal disposed beneath the encapsulation member.

\* \* \* \* \*